United States Patent
Sentoku

(10) Patent No.: US 8,338,805 B2
(45) Date of Patent: Dec. 25, 2012

(54) RETICLE MANUFACTURING METHOD, SURFACE SHAPE MEASURING APPARATUS AND SIGNAL PROCESSOR

(75) Inventor: Koichi Sentoku, Kawachi-gun (JP)

(73) Assignee: Canon Kabushiki Kaisha (JP)

( * ) Notice: Subject to any disclaimer, the term of this patent is extended or adjusted under 35 U.S.C. 154(b) by 394 days.

(21) Appl. No.: 12/707,441

(22) Filed: Feb. 17, 2010

(65) Prior Publication Data

US 2010/0209828 A1    Aug. 19, 2010

(30) Foreign Application Priority Data

Feb. 18, 2009   (JP) ................................ 2009-035126

(51) Int. Cl.
*G21K 5/04* (2006.01)
*H01J 37/26* (2006.01)

(52) U.S. Cl. ..................... 250/492.3; 250/306; 250/307; 250/492.1; 430/296; 430/297; 430/298; 430/299

(58) Field of Classification Search ............... 250/492.1, 250/492.2, 492.21, 492.22, 492.3, 306, 307, 250/309, 310, 311; 702/35, 36, 40; 430/296, 430/298, 299
See application file for complete search history.

(56) References Cited

U.S. PATENT DOCUMENTS

2005/0214657 A1    9/2005  Mitsui
2007/0103659 A1 *  5/2007  Yoshitake et al. .............. 355/53

FOREIGN PATENT DOCUMENTS

| JP | 2005-274953 A | 10/2005 |
| JP | 2007-150286 A | 6/2007 |
| JP | 2004-214415 A | 7/2007 |

* cited by examiner

*Primary Examiner* — David A Vanore
*Assistant Examiner* — Nicole Ippolito
(74) *Attorney, Agent, or Firm* — Rossi, Kimms & McDowell LLP

(57) ABSTRACT

A reticle manufacturing method of the present invention comprises the steps of holding a reference mask blank by a reference chuck to measure a surface shape of the reference mask blank as a first surface shape, holding the reference mask blank by a reticle chuck of the exposure apparatus to measure a surface shape of the reference mask blank as a second surface shape, holding the electron beam drawing mask blank by the reference chuck to measure a surface shape of the electron beam drawing mask blank as a third surface shape, calculating a difference between the measurement values of the first surface shape and the second surface shape as a first deference value, calculating, as a forth surface shape, a surface shape of the electron beam drawing mask blank held by the reticle chuck on the basis of the first deference value and the measurement value of the third surface shape, and drawing the pattern on the electron beam drawing mask blank on the basis of the forth surface shape.

6 Claims, 6 Drawing Sheets

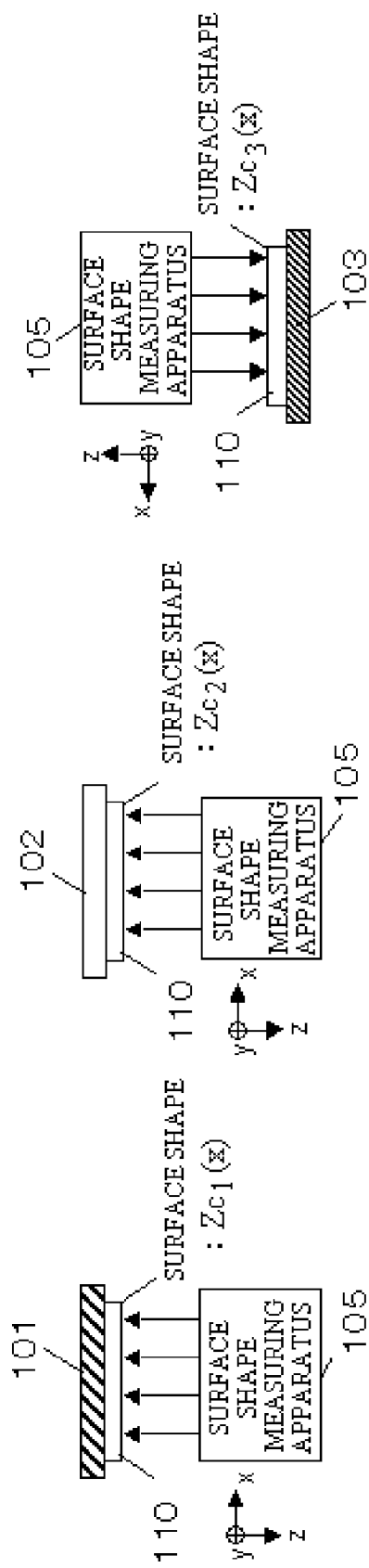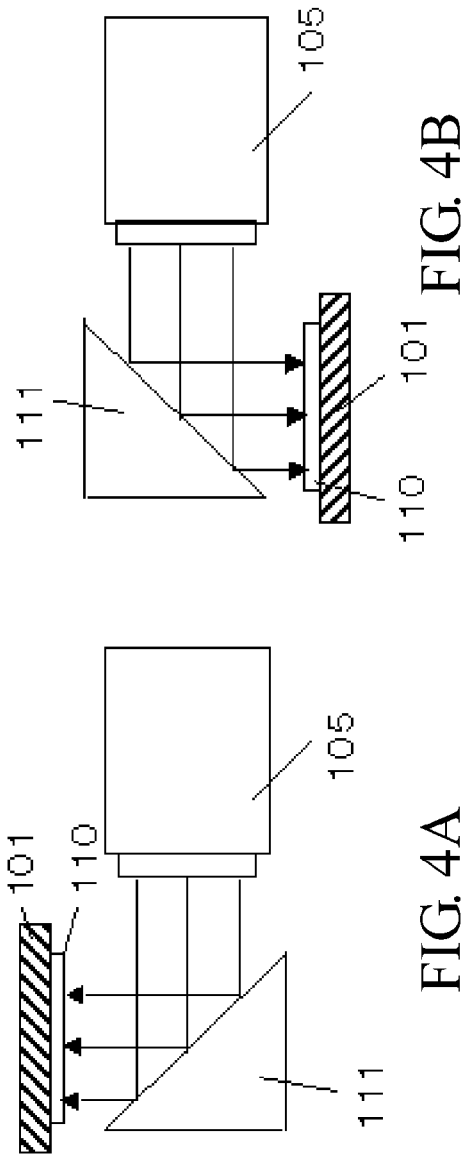

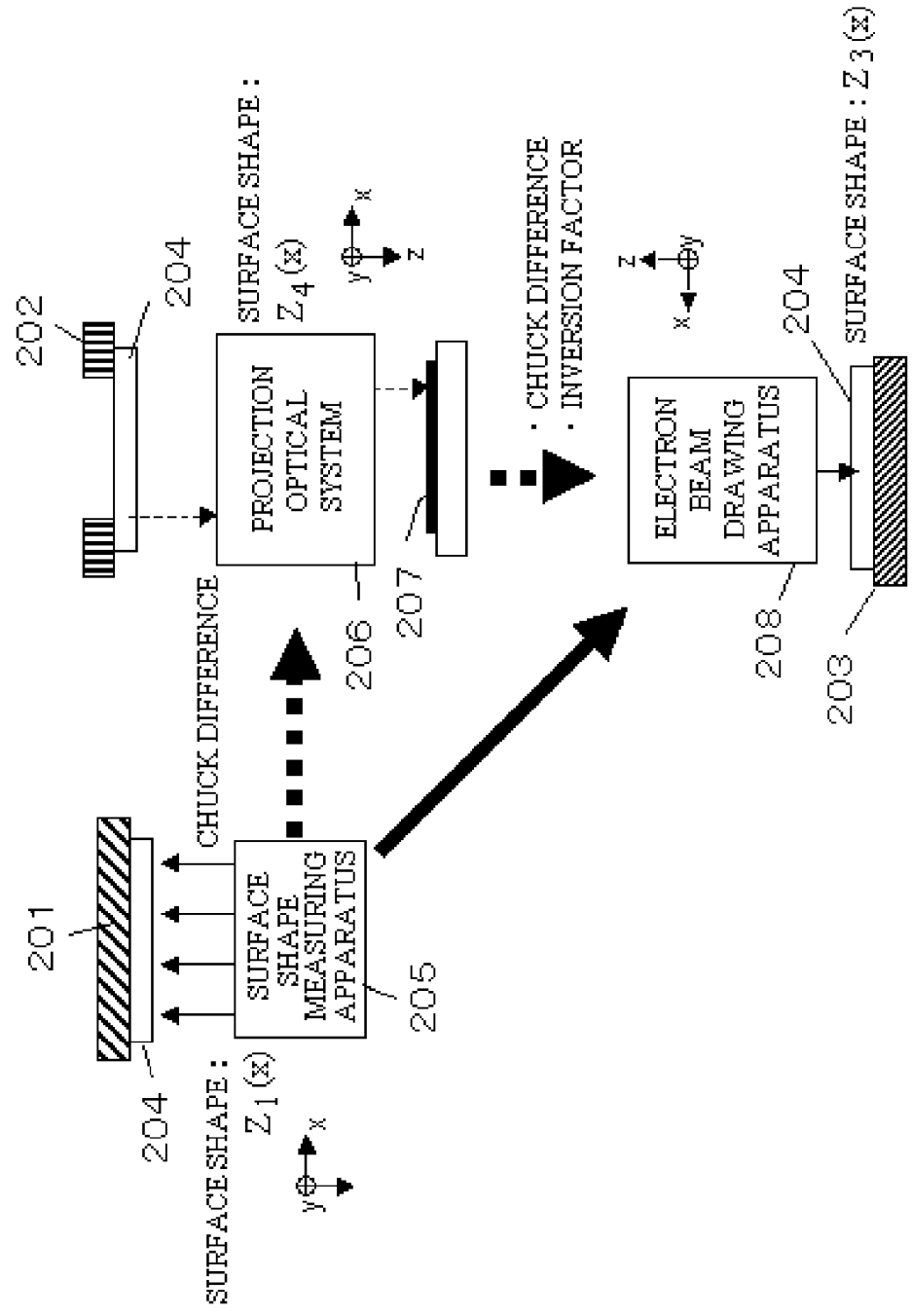

RETICLE MANUFACTURING METHOD, SURFACE SHAPE MEASURING APPARATUS AND SIGNAL PROCESSOR

BACKGROUND OF THE INVENTION

Field of the Invention

In a conventional exposure apparatus, when there are surface asperities on a suction surface of a reticle or a suction surface of a reticle chuck, a surface shape of a patterning area on the reticle changes due to the influence of a plane correction when sucking the reticle and a patterning position on the reticle with respect to a projection optical system is shifted. As a result, a position of an exposure pattern projected to a wafer is also shifted and it causes an overlay error.

Moreover, a similar problem is caused in an extreme ultraviolet light exposure apparatus that uses a reflective reticle.

Furthermore, a process patterning to a mask blank using the electron beam drawing apparatus is performed by sucking the mask blank onto a chuck included in the electron beam drawing apparatus. Therefore, when suction surface shapes of a chuck of electron beam drawing apparatus and the reticle chuck in the exposure apparatus are different from each other, the smoothness on patterning surfaces of the sucked mask blanks are different from each other and the overlay error is caused similarly to the case of patterning on the reticle.

Japanese Patent Laid-Open No. 2007-150286 discloses a measuring method of measuring a surface of a mask before a patterning process that contacts to a suction surface of a reticle chuck (hereafter, referred to as an "electron beam drawing mask blank"), that is, a back surface shape of the electron beam drawing mask blank, and measures the suction surface shape of a reticle chuck in an exposure apparatus. Then, a surface shape of the electron beam drawing mask blank sucked by a reticle chuck in the exposure apparatus is calculated by using measurement values of both a back surface shape of the electron beam drawing mask bank and the suction surface of the reticle chuck in the exposure apparatus. Based on these calculation results, a correction amount of a planer surface of the electron beam drawing mask blank is obtained to correct a patterning position by the electron beam drawing apparatus.

Japanese Patent Laid-Open No. 2005-274953 discloses a measuring method of measuring a planer shape of an electron beam drawing mask blank sucked to a reticle chuck of an exposure apparatus after the electron beam drawing mask blank is conveyed into the exposure apparatus. Then, a displacement amount of an exposure pattern transmitted to a wafer which is caused by a measured planer shape is calculated, and based on the calculation result, a patterning position is corrected by the electron beam drawing apparatus.

Japanese Patent Laid-Open No. 2004-214415 discloses a method of measuring a self-respect transformation amount of the electron beam drawing mask blank when patterning by the electron beam drawing apparatus by using an optical measurement system in the electron beam drawing apparatus, and correcting the patterning position on the basis of a distortion of the surface of the electron beam drawing mask blank caused by the self-respect transformation.

However, in the method disclosed in Japanese patent Laid-Open No. 2007-150286, a state when measuring the electron beam drawing mask blank that is a measured object or the reticle chuck is different from an actual state mounted in an apparatus, and therefore the measurement accuracy may be decreased.

With respect to the method disclosed in Japanese patent Laid-Open No. 2005-274953, the exposure apparatus is used for a surface shape measurement of the electron beam drawing mask blank, and therefore the productivity decreases due to the stoppage of an original lithography process.

Moreover, with respect to the method disclosed in Japanese patent Laid-Open No. 2004-214415, the electron beam drawing apparatus includes a measurement system for performing the measurement and therefore the apparatus may be complicated.

SUMMARY OF THE INVENTION

The present invention provides a reticle manufacturing method capable of performing highly accurate exposure without the complication of an apparatus and the decrease in productivity.

A reticle manufacturing method as one aspect of the present invention is a method of drawing a pattern on an electron beam drawing mask blank to manufacture a reticle. The reticle manufacturing method comprises the steps of holding a reference mask blank by a reference chuck to measure a surface shape of the reference mask blank as a first surface shape, holding the reference mask blank by a reticle chuck of an exposure apparatus to measure the surface shape of the reference mask blank as a second surface shape, holding the electron beam drawing mask blank by the reference chuck to measure a surface shape of the electron beam drawing mask blank as a third surface shape, calculating a difference between measurement values of the first surface shape and the second surface shape as a first deference value, calculating, as a forth surface shape, a surface shape of the electron beam drawing mask blank held by the reticle chuck on the basis of the first deference value and the measurement value of the third surface shape, and drawing the pattern on the electron beam drawing mask blank on the basis of the forth surface shape.

A surface shape measuring apparatus as another aspect of the present invention is an apparatus which measures a surface shape of a mask blank. The surface shape measuring apparatus comprises a measurement unit configured to measure a surface shape of a reference mask blank held by a reference chuck as a first surface shape, a surface shape of the reference mask blank held by a reticle chuck of an exposure apparatus as a second surface shape, and a surface shape of an electron beam drawing mask blank held by the reference chuck as a third surface shape, a memory configured to store the measurement values of the first surface shape and the second surface shape measured by the measurement unit, and a calculator configured to calculate a correction value of a pattern position drawn on the electron beam drawing mask blank on the basis of the measurement values of the first surface shape and the second surface shape and the measurement value of the third surface shape.

A signal processer as another aspect of the present invention is used for a surface shape measuring apparatus which measures a surface shape of a mask blank. The signal processer comprises a memory configured to store measurement values of a surface shape of a reference mask blank held by a reference chuck, a surface shape of the reference mask blank held by a reticle chuck of an exposure apparatus, and a surface shape of an electron beam drawing mask blank held by the reference chuck, and a calculator configured to calculate a correction value of a pattern position drawn on the electron beam drawing mask blank on the basis of the measurement values.

BRIEF DESCRIPTION OF THE DRAWINGS

FIG. 3 shows a measurement of a surface shape of a reflective reference mask blank in embodiment 1.

FIG. 4 shows a measurement of a surface shape when a patterning surface of a reference mask blank in the embodiment of the present invention faces upper and lower directions.

FIG. 7 shows a measuring method of a surface shape of an electron beam drawing mask blank in embodiment 2 of the present invention.

DESCRIPTION OF THE EMBODIMENTS

Figure 1:
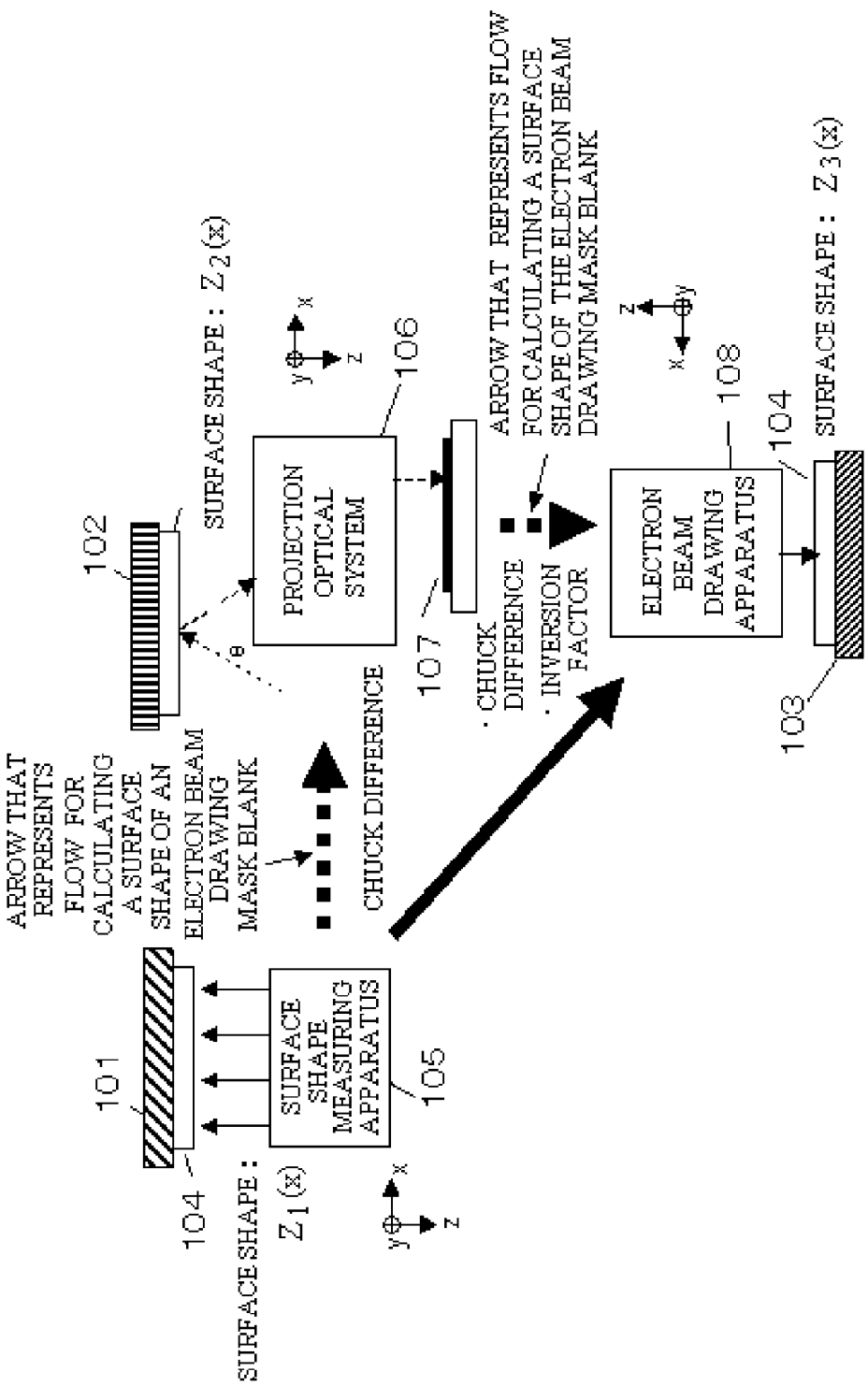
FIG. 1 shows a measuring method of a surface shape of an electron beam drawing mask blank in embodiment 1 of the present invention.
Figure 2:
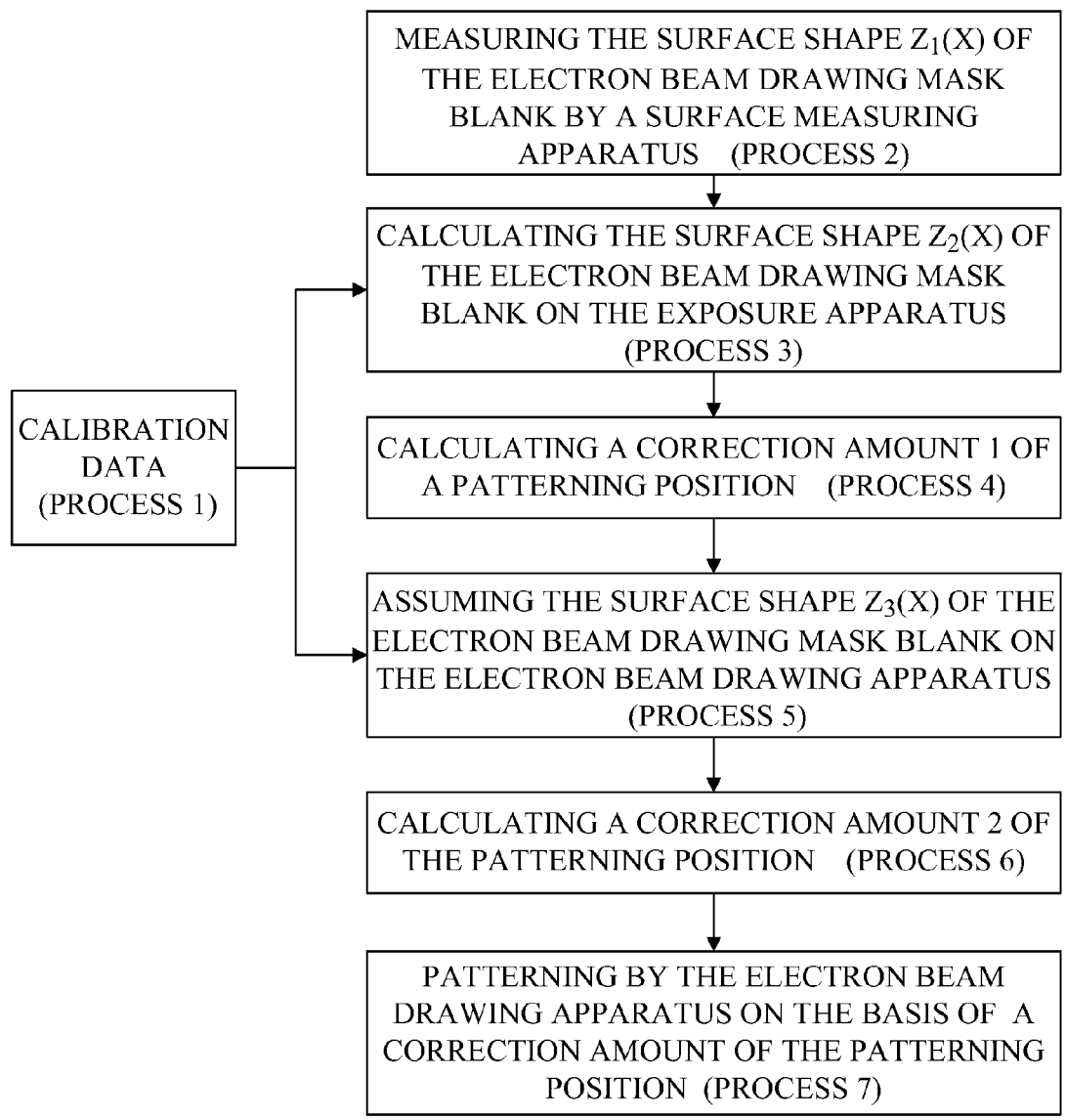
FIG. 2 shows a process calculating a correction amount of a patterning position in embodiment 1.

Exemplary embodiments of the present invention will be described below with reference to the accompanying drawings.

Embodiment 1

First of all, embodiment 1 of the present invention will be described with reference to FIGS. 1A, 1B, 1C, 2, and 3. This embodiment uses a reference chuck 101 and a reference mask blank 110 to indirectly calculate a reticle surface shape sucked onto a reticle chuck 102 of an exposure apparatus. Then, a patterning position (drawing position) is corrected in an electron beam drawing apparatus 108 on the basis of the result.

Here, the reference chuck 101 is different from the reticle chuck 102 used in the exposure apparatus and a chuck 103 used in the electron beam drawing apparatus. Moreover, the reference mask blank 110 is different from a mask used when actually drawing patterns (hereafter, referred to as an electron beam drawing mask blank), and is used for measuring the difference of suction surface shapes between two or more chucks. Furthermore, the patterning position is a position (designed value) where an exposure pattern is to be drawn to the electron beam drawing mask blank by using the electron beam drawing apparatus 108, and is not a shape of the exposure pattern on the reticle.

An electron beam drawing mask blank 104 is carried to the electron beam drawing apparatus 108 shown in FIG. 1C so that the patterning is performed after a surface shape $Z1(x)$ sucked to the reference chuck 101 in FIG. 1A is measured. However, the patterning is performed without using a value of the surface shape $z1(x)$ directly, and correction data of the patterning position is made considering a surface shape $z2(x)$ shown in FIG. 1B or a surface shape $z3(x)$ shown in FIG. 1C.

Hereafter, the process of calculating correction data will be described.

First, as process 1, a calculation of calibration data to calculate the surface shape $Z2(x)$ and the surface shape $Z3(x)$ of the electron beam drawing mask blank 104 will be described. The calibration data mean a difference between suction surface shapes in each chuck (chuck difference), a difference between surface shapes of the mask blank tuned up by the suction and the mask blank turned down (held) by the suction (inversion factor), or the like.

In process 1, as shown in FIG. 3A, the reference mask blank 110 is sucked onto the reference chuck 101 and a surface shape of the reference mask blank 110 (first surface shape) is measured by using the following EQUATION 1.

$$Zc_1(x)=(x_1,z_{c1\_1}), (x_2,z_{c1\_2}) \ldots (x_n,z_{c1\_n}) \quad \text{[EQUATION 1]}$$

In the above expression, x denotes position coordinates in an x direction of the reference mask blank 110, and $Zc1(x)$ denotes field of sets of height information in a z direction at a position x. For easy description, this embodiment regards coordinates on the mask blank as one dimension. In a case where position coordinates of two dimension is used, x and y may be determined as the position coordinates.

Next, as shown in FIG. 3B, the reference mask blank 110 is sucked onto the reticle chuck 102 in the exposure apparatus, and a surface shape of the reference mask blank 110 (second surface shape) is measured by using the following EQUATION 2.

$$Zc_2(x)=(x_1,z_{c2\_1}), (x_2,z_{c2\_2}) \ldots (x_n,z_{c2\_n}) \quad \text{[EQUATION 2]}$$

This measurement may also be performed by an assembling process of the exposure apparatus. In that case, the reference chuck 101 is detached from a surface shape measuring apparatus 105 and then the reticle chuck 102 detached from the exposure apparatus is set in the surface shape measuring apparatus 105.

Next, as shown in FIG. 3C, the reference mask blank 110 is sucked onto a chuck 103 of the electron beam drawing apparatus 108, and then a surface shape of the reference mask blank 110 (fifth surface shape) is measured by using the following EQUATION 3.

$$Zc_3(x)=(x_1,z_{c3\_1}), (x_2,z_{c3\_2}) \ldots (x_n,z_{c3\_n}) \quad \text{[EQUATION 3]}$$

In this case, the chuck 103 of the electron beam drawing apparatus is detached from the electron beam drawing apparatus 108 and then is set in the surface shape measuring apparatus 105.

As above, since the surface shapes are measured by using the same reference mask blank 110, the difference between the suction surface shapes in each chuck is obtained by calculating a difference value between measurement values of each surface shape of the reference mask blank 110 sucked onto each chuck. In this case, the surface shape change of the reference mask blank 110 is generated depending on the suction surface shapes in each chuck, and a shape change due to a synergic effect between the suction surface shapes in each chuck and the reference mask blank 110 is ignorable even if it is generated.

A difference value (first difference value) between the suction surface shapes of the reticle chuck 102 of the exposure apparatus and the reference chuck 101 is represented as the following EQUATION 4.

$$\Delta Zc_a(x)=Zc_2(x)-Zc_1(x) \quad \text{[EQUATION 4]}$$

A difference value (third difference value) between the suction surface shapes of the chuck 103 of the electron beam drawing apparatus and the reticle chuck 102 of the exposure apparatus is represented as the following EQUATION 5.

$$\Delta Zc_b(x)=Zc_3(x)-Zc_2(x) \quad \text{[EQUATION 5]}$$

Moreover, as shown in FIGS. 1A and 1C, the surface (patterning surface) of the mask blank in the exposure apparatus using the reflective reticle is turned down, and the surface of the mask blank of the electron beam drawing apparatus 108 is turned up. Therefore, it is necessary to consider the difference between the surface shapes, which is caused by the up-and-down inversion factor of the surface of the mask blank. The difference between the surface shapes of the mask blank, which is caused by this inversion factor is measured by the surface shape measuring apparatus 105 that is applicable even if a part of components (movable mirror 111) rotates so that the measured objection surface reverses in upper and lower directions as shown in FIGS. 4A and 4B. Here, a surface shape when the surface of the mask blank turns down is represented as $Z_{down}(x)$ and a surface shape when the surface of the mask blank turns up is represented as $Z_{up}(x)$.

A difference value between the surface shapes of the mask blank by this inversion factor is represented by the following EQUATION 6.

$$\Delta Z c_r(x) = Z_{down}(x) - Z_{up}(x) \qquad \text{[EQUATION 6]}$$

In the above EQUATION 6, the surface shape of the mask blank is calculated considering the value of $\Delta Zcr(x)$ if the value of $\Delta Zcr(x)$ exceeds a predetermined tolerance.

Moreover, when the difference between the suction surface shapes in each chuck is ignorable because it is small and within the predetermined tolerance, ignorable terms in the calibration data calculated by EQUATIONS 4 and 5 may be excluded. For example, if there is no difference between the suction surfaces of the reticle chuck 102 of the exposure apparatus and the reference chuck 101, EQUATION 4 is needless, and if there is no difference between the suction surfaces of the chuck 103 of the electron beam drawing apparatus and the reticle chuck 102 of the exposure apparatus, EQUATION 5 is needless.

Next, as process 2, a surface shape (third surface shape) of the electron beam drawing mask blank 104 for which the patterning is to be performed is measured in a state where it is sucked onto the reference chuck 101. The surface shape of the electron beam drawing mask blank 104 measured by the surface shape measuring apparatus 105 is measured by using the following EQUATION 7.

$$Z_1(x) = (x_1, z_1), (x_1, z_2) \ldots (x_n, z_n) \qquad \text{[EQUATION 7]}$$

The electron beam drawing mask blank 104 actually moves from the surface shape measuring apparatus 105 in FIG. 1A toward the electron beam drawing apparatus 108 in FIG. 1C (shown by a solid line arrow) between the apparatuses. However, it is necessary that a correction value of an IP error (image placement error; patterning position error) caused by the surface shape change of the mask blank is calculated on the basis of the surface shape on condition that a drawn mask is sucked onto the reticle chuck 102 of the exposure apparatus.

Therefore, as process 3, a surface shape $Z2(x)$ (fourth surface shape) in a state where the electron beam drawing mask blank 104 is sucked onto the reticle chuck 102 of the exposure apparatus is calculated by the following EQUATION 8.

$$Z_2(x) = Z_1(x) + \Delta Z c_a(x) \qquad \text{[EQUATION 8]}$$

In this expression, $Z_1(x)$ denotes the surface shape of the electron beam drawing mask blank 104 that is sucked onto the reference chuck 101, which has been measured in process 2, and $\Delta Zca(x)$ denotes the difference value between the suction surface shapes of the reticle chuck 102 of the exposure apparatus and the reference chuck 101, which has been calculated in process 1. When the difference between the suction surface shapes of the reticle chuck 102 of the exposure apparatus and the reference chuck 101 is within the predetermined tolerance, $\Delta Zca(x)$ may be excluded.

Next, a correction amount 1 of the patterning position is calculated as process 4.

A position of an object plane with respect to a projection optical system 106 when the exposure apparatus performs a scanning exposure is calculated every predetermined area (for example, every exposure slit width) on the basis of the surface shape of the electron beam drawing mask blank 104 on the reticle chuck 102 of the exposure apparatus, which has been calculated in process 3.

An exposure slit width is defined as an area between Xa and Xb, the exposure slit width between Xa and Xb is divided into n−1 equal parts (n is a positive integer two or more), each of x positions and height values in a z direction are represented as (X1,Z1), (X2,Z2) ... (Xn,Zn), and a straight line (linear function approximation) that optimally fits with respect to numerical values of these n groups, which is so-called an object plane, is calculated.

The object plane is represented by the following EQUATION 9.

$$z = c \cdot x + d \qquad \text{[EQUATION 9]}$$

In this case, EQUATION 9 can be obtained as the following EQUATION 10 by using the least squares method.

[EQUATION 10]

$$c = \frac{n \sum_{i=1}^{n} x_i z_i - n \sum_{i=1}^{n} x_i \sum_{i=1}^{n} z_i}{n \sum_{i=1}^{n} x_i^2 - \left(\sum_{i=1}^{n} x_i\right)^2} \qquad (10a)$$

$$d = \frac{n \sum_{i=1}^{n} x_i^2 \sum_{i=1}^{n} z_i - \sum_{i=1}^{n} x_i z_i \sum_{i=1}^{n} x_i}{n \sum_{i=1}^{n} x_i^2 - \left(\sum_{i=1}^{n} x_i\right)^2} \qquad (10b)$$

Next, a difference value (second difference value) between the object plane represented by EQUATION 9 and height $Z2(x)$ in the z direction of the surface shape in the exposure slit width between Xa and Xb is calculated as $\Delta Z2(x)$.

$$\Delta Z_2(x) = (X_1, \delta Z_1), (X_2, \delta Z_2) \ldots (X_n, \delta Z_n) \qquad \text{[EQUATION 11]}$$

Figure 5:
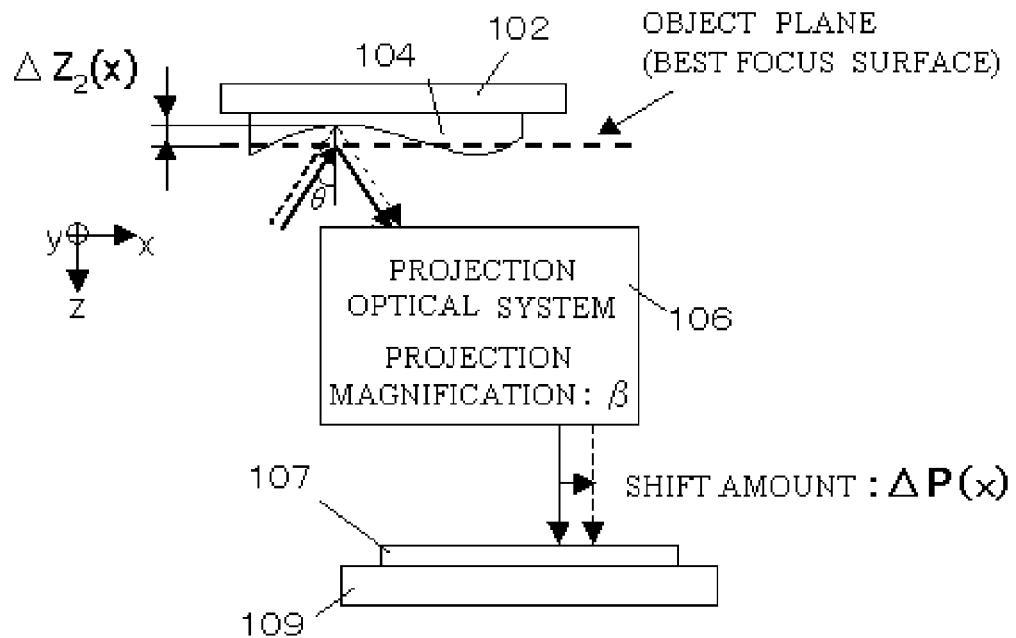
FIG. 5 shows an image-forming position shift by a reflective reticle in embodiment 1.

When there is a convexo-concave difference of $\Delta Z2(x)$ between the object plane and the reflective reticle surface as shown in FIG. 5, an imaging position of a pattern on a reticle onto a wafer 107 shifts by LP corresponding to the convexo-concave difference.

$\Delta P$ can be obtained as the following EQUATION 12.

$$\Delta P(x) = \Delta Z_2(x) \times \beta \times \tan\theta \qquad \text{[EQUATION 12]}$$

In this expression, $\theta$ is an irradiation angle of the exposure light to the mask blank in the exposure apparatus.

Therefore, a patterning position correction amount 1 (first correction value) on the mask blank that cancels the imaging position shift amount at a position of the wafer 107, which has been calculated by EQUATION 12, is represented as the following EQUATION 13.

$$\Delta E_1(x) = \Delta Z_2(x) \times \tan\theta \qquad \text{[EQUATION 13]}$$

Next, as process 5, a surface shape $Z3(x)$ when the electron beam drawing mask blank 104 is sucked onto the chuck 103 of the electron beam drawing apparatus 108 is calculated. The surface shape $Z3(x)$ is calculated as the following EQUATION 14 by using the surface shape $Z2(x)$, which is calculated in process 3, and the difference value $\Delta Zcb(x)$, which is calculated in process 1.

$$Z_3(x) = Z_2(x) + \Delta Z c_b(x) \qquad \text{[EQUATION 14]}$$

In this expression, when the difference between suction shapes of the reticle chuck 102 of the exposure apparatus and the chuck 103 of the electron beam drawing apparatus is within a predetermined tolerance, ΔZcb(x) may be excluded.

Next, as process 6, a patterning position correction amount 2 is calculated on the basis of the difference between the surface shapes of the electron beam drawing mask blank 104 in FIGS. 1B and 1C.

Figure 6A:
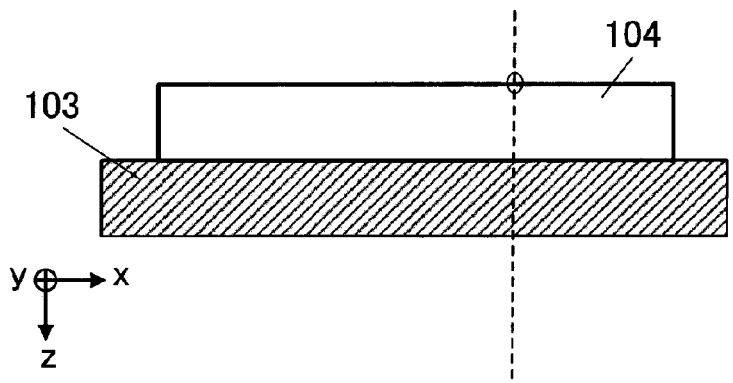
FIG. 6 shows a displacement of a patterning position depending on a change of a surface shape of the reticle in the embodiment of the present invention.
Figure 6B:
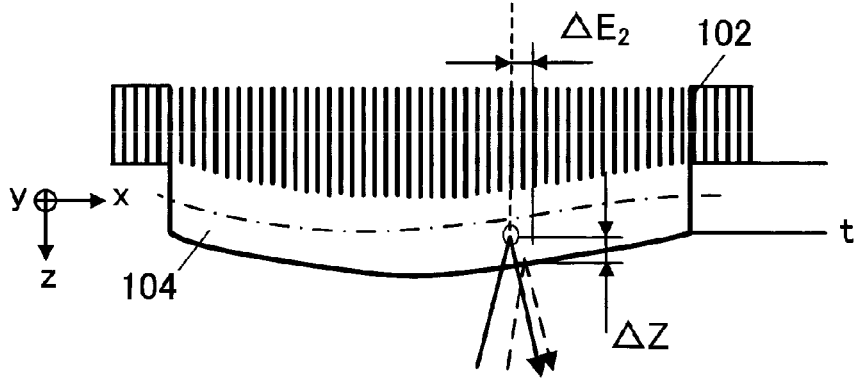

In this case, ΔE2 as the patterning position correction amount 2 (second correction value) is generated by the influence of the expansion and contraction of the mask blank surface due to the surface shape change of the electron beam drawing mask blank as shown in FIG. 6. This ΔE2 can be obtained by the following EQUATION 15.

$$\Delta E_2(x) = \frac{t}{2} \times \frac{\partial^2 (\Delta Zc_b(x))}{\partial x^2} \qquad \text{[EQUATION 15]}$$

In this expression, ΔZcb(x) denotes a difference value between the surface shapes of the reference mask blank 110 in FIGS. 1B and 1C, which have been calculated in process 1, and t denotes a thickness of the mask blank.

As a result, the patterning position correction amount of the electron beam drawing apparatus 108 by which the correction is actually performed can be calculated by adding the ΔE1(x), which is obtained in process 4, and the ΔE2(x), which is obtained in process 6, as the following EQUATION 16.

$$S(x) = \Delta E_1(x) + \Delta E_2(X) \qquad \text{[EQUATION 16]}$$

In other words, the patterning position correction amount can be quickly calculated without the occupation of the exposure apparatus for the surface shape measurement of the mask blank by using the reference mask blank 110 and the reference chuck 101.

Embodiment 2

Embodiment 2 of the present invention will be described with reference to FIGS. 7A, 7B, 7C and 8. Though embodiment 1 was described the manufacturing method of the reflective reticle, this embodiment will describe a manufacturing method of a transmissive reticle. The explanation that overlaps with that of embodiment 1 will be omitted.

Figure 8:
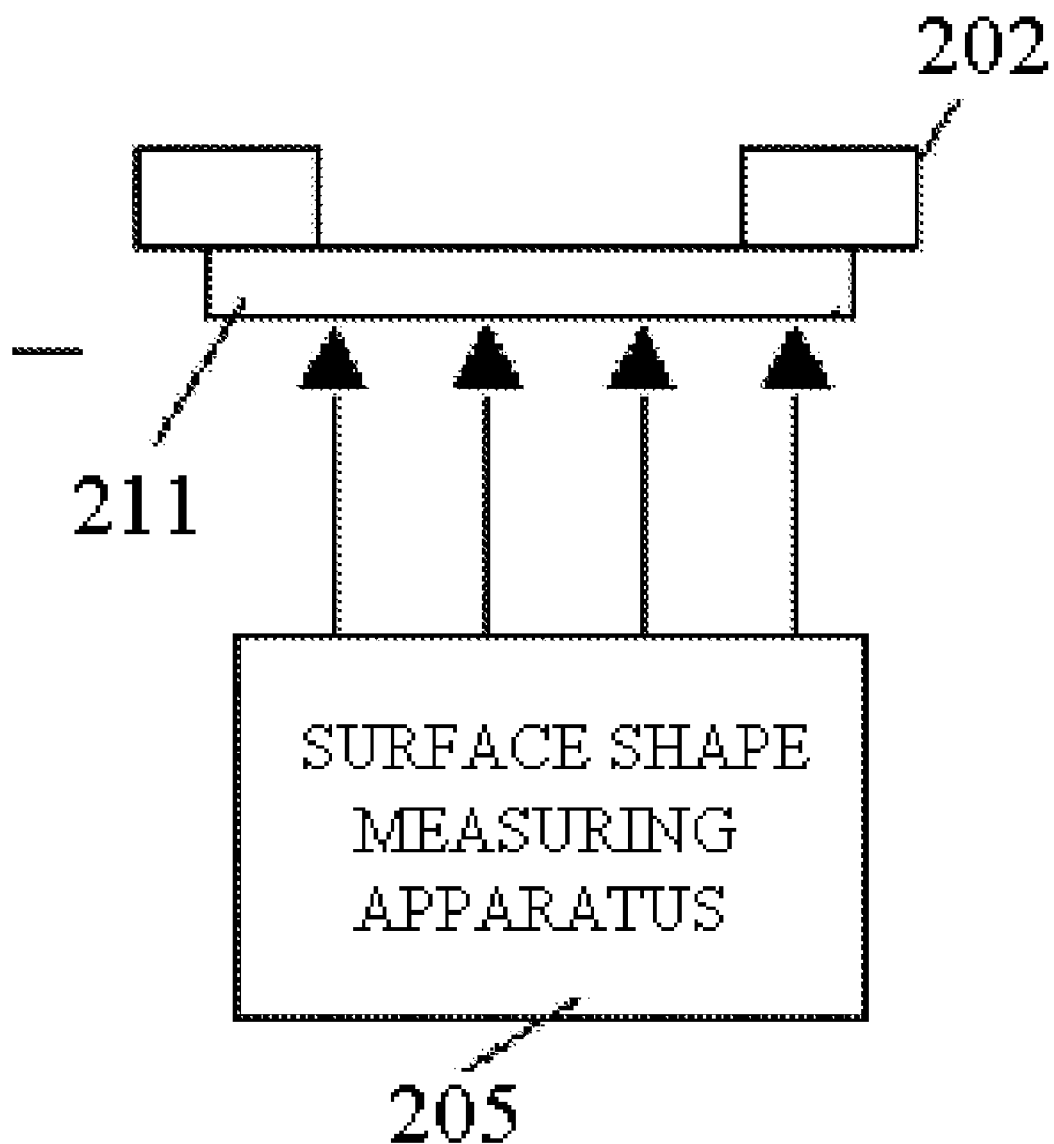
FIG. 8 shows a measuring method of a surface shape of a transmissive reference mask blank in embodiment 2.

Similarly to embodiment 1, the calibration data is calculated by using a reference mask blank 211 in process 1. At this time, as shown in FIG. 8, a surface shape of the reference mask blank 211 is measured by sucking the reference mask blank 211 on a reticle chuck 202 of an exposure apparatus. Moreover, similarly to embodiment 1, a surface shape Z1(x) of the reference mask blank 204 sucked on the reference chuck 201 is calculated in process 2, and a surface shape Z2(x) of the reference mask blank 204 sucked on the reticle chuck of the exposure apparatus is calculated in process 3.

However, since this embodiment is a manufacturing method of the transmissive reticle as shown in FIG. 7(b), process 4 of this embodiment is different from the process of embodiment 1.

In this embodiment, an angle by the convexo concave on the mask blank surface within a narrow range is a minute angle, and therefore a shift amount of an exposure position due to the change of a diffraction angle of a principal ray is ignorable. Therefore, with regard to process 4, the object plane for the area of the exposure slit width is calculated by using the least squares method and the mapping data of the reticle pattern is only made.

Next, similarly to embodiment 1, a surface shape Z3(x) when the electron beam drawing mask blank 204 is sucked on the chuck 203 of the electron beam drawing apparatus 208 is calculated as process 5.

With regard to process 6, the patterning position correction amount is calculated on the basis of the difference between the surface shapes of the electron beam drawing mask blank 204 in FIGS. 7B and 7C.

In this case, as shown in FIG. 6, a patterning position correction amount ΔE3 is generated by the influence of the expansion and contraction of the mask blank surface due to the surface shape change of the electron beam drawing mask blank 204. This ΔE3 can be obtained by the following EQUATION 17.

$$\Delta E_3(x) = \frac{t}{2} \times \frac{\partial^2 (\Delta Zc_b(x))}{\partial x^2} \qquad \text{[EQUATION 17]}$$

In this expression, ΔZcb(x) denotes the difference value between the surface shapes of the reference mask blank 210 in FIGS. 7B and 7C calculated in process 1, and t denotes the thickness of the mask blank.

Therefore, the patterning position correction amount of the electron beam drawing apparatus 208 in this embodiment is represented as ΔE3(x) obtained in process 6.

Thus, the patterning position correction amount can be quickly calculated without the occupation of the exposure apparatus for the surface shape measurement of the mask blank by using the reference mask blank 210 and the reference chuck 201.

In addition, the calculation of the surface shape described in embodiments 1 and 2 may be performed by the surface shape measuring apparatus, the exposure apparatus and a computer networked to the electron beam drawing apparatus (signal processor). Moreover, it may also be performed by a plurality of computers that control the surface shape measuring apparatus, the exposure apparatus and the electron beam drawing apparatus.

Moreover, a memory for storing the measured measurement values may be provided in the surface shape measuring apparatus to calculate the patterning position correction amount in the surface shape measuring apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-035126, filed on Feb. 18, 2009, which is hereby incorporated by reference herein in its entirety.

What is claimed is:

1. A reticle manufacturing method of drawing a pattern on an electron beam drawing mask blank to manufacture a reticle, said reticle manufacturing method comprising the steps of:

holding a reference mask blank by a reference chuck to measure a surface shape of the reference mask blank as a first surface shape;

holding the reference mask blank by a reticle chuck of an exposure apparatus to measure a surface shape of the reference mask blank as a second surface shape;

holding the electron beam drawing mask blank by the reference chuck to measure a surface shape of the electron beam drawing mask blank as a third surface shape;

calculating a difference between measurement values of the first surface shape and the second surface shape as a first difference value;

calculating, as a forth surface shape, a surface shape of the electron beam drawing mask blank held by the reticle chuck on the basis of the first difference value and the measurement value of the third surface shape; and drawing the pattern on the electron beam drawing mask blank on the basis of the forth surface shape.

2. The reticle manufacturing method according to claim 1, further comprising the steps of:

calculating a position of an object plane in a projection optical system of the exposure apparatus using the fourth surface shape;

calculating, as a second difference value, a difference between the position of the object plane and the fourth surface shape;

calculating a first correction value of a drawing position of the pattern using the second difference value; and drawing the pattern on the electron beam drawing mask blank using the first correction value.

3. The reticle manufacturing method according to claim 2, further comprising the steps of:

holding the reference mask blank by a chuck of an electron beam drawing apparatus to measure a surface shape of the reference mask blank as a fifth surface shape;

calculating, as a third difference value, a difference between the measurement values of the fifth surface shape and the second surface shape;

calculating a second correction value of the drawing position of the pattern on the basis of the third difference value; and drawing the pattern on the electron beam drawing mask blank using a value obtained by adding the first correction value to the second correction value.

4. The reticle manufacturing method according to claim 1, wherein the fourth surface shape is calculated by adding the first difference value and the measurement value of the third surface shape.

5. The reticle manufacturing method according to claim 1, wherein the first surface shape is opposed to a holding surface on which the reference mask blank is held by the reference chuck.

6. A surface shape measuring apparatus that measures a surface shape of a mask blank, said surface shape measuring apparatus comprising:

a measurement unit configured to measure a surface shape of a reference mask blank held by a reference chuck as a first surface shape, a surface shape of the reference mask blank held by a reticle chuck of an exposure apparatus as a second surface shape, and a surface shape of an electron beam drawing mask blank held by the reference chuck as a third surface;

a memory configured to store the measurement values of the first surface shape and the second surface shape, which are measured by the measurement unit; and a calculator configured to calculate a fourth surface shape, which is a surface shape of the electron beam drawing mask blank held by the reticle chuck, on the basis of a difference between the measurement values of the first surface shape and the second surface shape and the measurement value of the third surface shape, wherein the calculator is further configured to calculate a correction value of a pattern position drawn on the electron beam drawing mask blank based on the fourth surface shape.

* * * * *